United States Patent
Cieslinski (10) Patent No.: US 8,228,425 B2
(45) Date of Patent: Jul. 24, 2012

(54) IMAGE SENSOR HAVING BOND PADS ARRANGED RELATIVE TO READ-OUT CIRCUIT

(75) Inventor: Michael Cieslinski, Ottobrunn (DE)

(73) Assignee: Arnold & Richter Cine Technik GmbH & Co. Betriebs KG (DE)

( * ) Notice: Subject to any disclaimer, the term of this patent is extended or adjusted under 35 U.S.C. 154(b) by 211 days.

(21) Appl. No.: 12/684,629

(22) Filed: Jan. 8, 2010

(65) Prior Publication Data

US 2010/0177227 A1 Jul. 15, 2010

(30) Foreign Application Priority Data

Jan. 13, 2009 (DE) .......................... 10 2009 004 409

(51) Int. Cl.
*H04N 5/225* (2006.01)
*H01L 31/00* (2006.01)
(52) U.S. Cl. ........................ 348/373; 257/459
(58) Field of Classification Search ................ 348/302, 348/308, 373–376; 250/208.1; 257/431, 257/433, 459
See application file for complete search history.

(56) References Cited

U.S. PATENT DOCUMENTS

| | | | |
|---|---|---|---|
| 4,644,411 A * | 2/1987 | Sato et al. .................... | 358/446 |
| 5,140,162 A | 8/1992 | Stettner | |
| 5,977,575 A * | 11/1999 | Mandai et al. ................ | 257/226 |
| 6,512,221 B2 | 1/2003 | Yen et al. | |
| 6,690,019 B2 | 2/2004 | Stettner et al. | |
| 6,744,526 B2 * | 6/2004 | McDermott et al. ......... | 358/1.11 |
| 6,812,790 B2 | 11/2004 | Ishihara et al. | |
| 7,276,683 B2 * | 10/2007 | Mori et al. ................. | 250/208.1 |
| 2009/0166774 A1 * | 7/2009 | Takahira ....................... | 257/431 |
| 2010/0085457 A1 * | 4/2010 | Yamashita .................... | 348/308 |

FOREIGN PATENT DOCUMENTS

EP 0768003 B1 3/2000

OTHER PUBLICATIONS

German Search Report of German Patent Application No. 10 2009 004 409.4 dated Apr. 1, 2009.
Translation of German Search Report of German Patent Application No. 10 2009 004 409.4 dated Apr. 1, 2009.

* cited by examiner

*Primary Examiner* — Timothy J Henn
(74) *Attorney, Agent, or Firm* — Amster Rothstein & Ebenstein LLP (57) ABSTRACT

The invention relates to an image sensor for electronic cameras, comprising a plurality of light-sensitive pixels for the generation of signals proportional to exposure and at least one read-out circuit coupled to the pixels and having a first section and a second section disposed downstream of the first section in a signal read-out direction, wherein the first section and the second section of the read-out circuit are each connected to at least one bond pad provided for the supply of an operating voltage and/or to at least one bond pad provided for the supply of a reference potential. At least some of the bond pads provided for the supply of the operating voltage and/or of the reference potential to the read-out circuit are arranged between the first section and the second sections of the read-out circuit.

22 Claims, 5 Drawing Sheets

Fig. 1

PRIOR ART

Fig. 2

PRIOR ART

IMAGE SENSOR HAVING BOND PADS ARRANGED RELATIVE TO READ-OUT CIRCUIT

The present invention relates to an image sensor for electronic cameras, in particular digital cine cameras, comprising a plurality of light-sensitive pixels for the generation of signals proportional to exposure and at least one read-out circuit coupled to the pixels and having a first section and having a second section connected downstream of the first section in a signal read-out direction, with the first section and the second section of the read-out circuit each being connected to at least one bond pad provided for the supply of an operating voltage and/or to at least one bond pad provided for the supply of a reference potential.

Known electronic cameras typically use an image sensor in CMOS or CCD technology which includes a plurality of light-sensitive elements—so-called pixels—which are, for example, arranged in rows and columns and which convert light incident through an objective of the camera into electrical signals. These signals can, for example, be charges, currents or voltages—in particular in dependence on the technology used and/or on the processing stage on the image sensor. A respective signal is in this respect proportional to a charge of the respective pixel collected by an exposure.

A read-out circuit, which is usually arranged at the margin of the image sensor, accepts the signals of the pixels for the further processing. The read-out circuit is as a rule divided into two sections different from one another. In a first section of the read-out circuit, for example, the signals of the pixels can be converted into electrical voltages and subsequently amplified and, in a second section which is connected downstream of the first section in the signal read-out direction, the amplified signals can then be output in analog form by means of a multiplexer at one or more outputs of the image sensor or can be digitized using one or more internal analog-to-digital converters and can be output in digital form.

The image sensor usually includes a plurality of inputs and outputs for the individual circuit parts of the image sensor via which the image sensor can communicate with external components or circuits, for example for the reception of control signals and/or for the output of the optionally amplified pixel signals. Inputs are moreover also provided which serve for the supply of an operating voltage and/or of a reference positional, in particular ground, to the image sensor.

The image sensor is usually initially present in the form of an unhoused semiconductor chip or die. To connect the image sensor to the electrical connectors, for example of a housing for the image sensor, or directly to another semiconductor chip via bond wires, the image sensor includes bond pads which are connected to the aforesaid inputs and outputs and on which the bond wires can be placed. The image sensor can then communicate with the external components or circuits and/or can be supplied with the operating potential and/or the reference potential via the bond wires.

Figure 1:
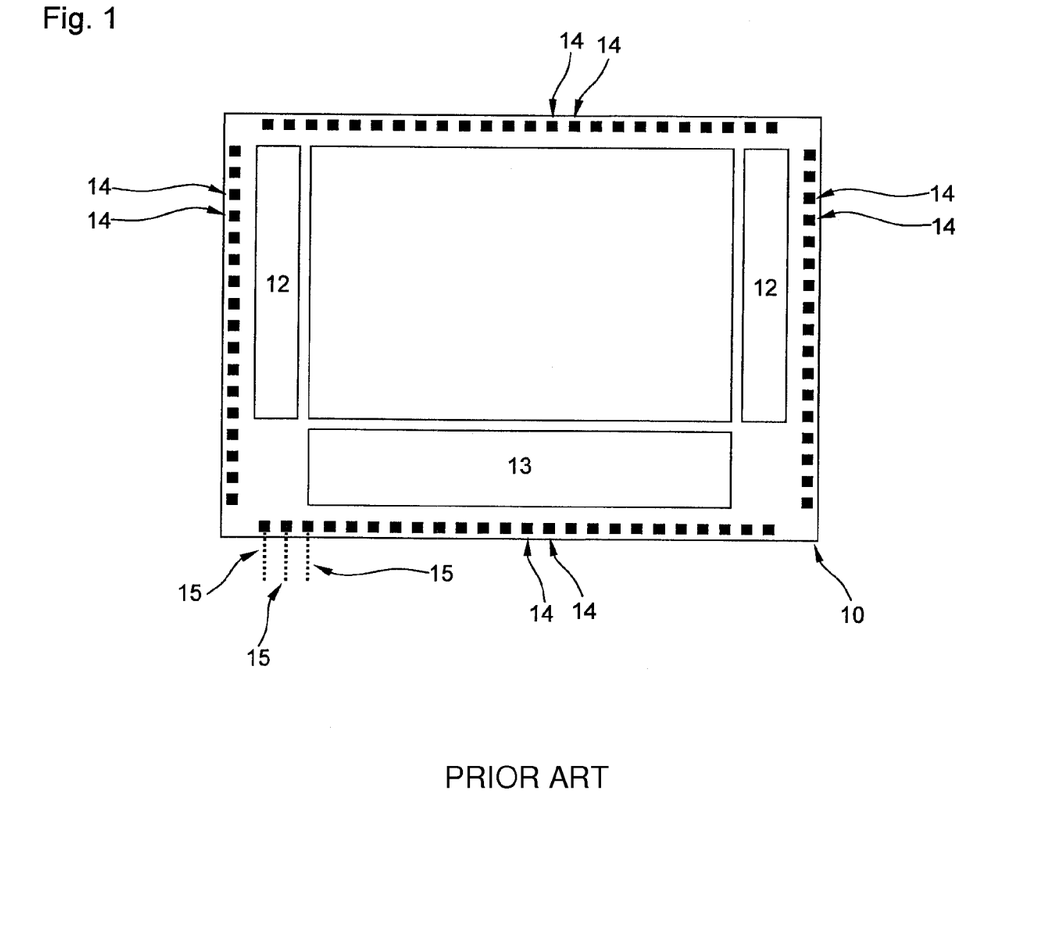
FIG. 1 an image sensor known from the prior art with a one-part read-out circuit.

FIG. 1 shows an image sensor 10 known from the prior art in the form of a semiconductor chip. The image sensor includes an image field or pixel field 11 which comprises a plurality of pixels (not shown) which are arranged in rows and columns (each not shown). The image sensor can have 2000 rows and 3000 columns, for example. The image sensor 10 furthermore includes a row selection circuit 12 by which a respective one of the rows can be selected for the reading out of the signals of the pixels of this row. The row selection circuit 12 is divided into two in the embodiment shown in FIG. 1 of a known image sensor 10 with the two parts of the row selection circuit 12 being adjacent to the image field 11 at both sides of the image field 11, i.e. in the longitudinal direction of the rows.

In addition, the image sensor 10 in accordance with FIG. 1 includes a read-out circuit 13 which is arranged beneath the image field 11 in FIG. 1. The read-out circuit 13 includes—not recognizable from FIG. 1—a first section and a second section such as have already been explained above and such as will be explained in more detail in the following. The second section is connected downstream of the first section in the signal read-out direction. The signal read-out direction is in this respect given by the read-out path of a respective signal of a pixel, i.e. the signal generated in a respective pixel is first processed in the first section of the read-out circuit on the reading out and is forwarded from there to the second section.

Finally, bond pads 14 can be recognized in FIG. 1 which are usually arranged at the outer margin of the image sensor 10 and peripherally, i.e. on all four sides of the image sensor 10. The bond pads 14 are connected to the aforesaid inputs and outputs (not shown) of the individual circuit parts of the image sensor 10 and make it possible that the image sensor 10 can communicate with other external components or circuits via bond wires 15, of which only a few are shown by way of example in FIG. 1, and can be supplied with the operating voltage and/or the reference potential.

The reading out of the signals of the pixels of the image sensor 10 usually takes place row-wise, i.e. row for row, to achieve a high frame rate, i.e. a high speed, with which an image of the sensor 10 can be read out. The signals of all the pixels of a respective row are therefore read out simultaneously. The signals of a respective row are usually read out via column lines for this purpose, are stored in sample-and-hold circuits and are amplified by means of column amplifiers. The reading out takes place by the first section of the read-out circuit 13 and at a preset clock frequency, for example 200 kHz.

The signals present in the first section of the read-out circuit 13 are then further processed by the second section, and indeed usually at a clock frequency which is higher than the clock frequency of the first section, for example at 50 MHz. The further processing in particular comprises the first signals of a respective row read out by the first section being output after one another by means of a multiplexer at an output of the read-out circuit 13. The read-out circuit 13 can, however, equally include a plurality of outputs so that in each case a plurality of signals of a respective row can be output simultaneously, i.e. groups of signals of a respective row can also be output after one another. Furthermore, an analog-to-digital conversion and/or an output amplification of the read out signals can also take place in the second section.

To increase the image rate further, the image sensor 10 usually has a so-called pipeline architecture, i.e. the reading out of the signals of the pixels of a row by the first section of the read-out circuit 13 takes place parallel with the output of the signals of the pixels of the row read out directly beforehand and now in the second section.

On the reading out of the signals of the pixels of a respective row, high currents flow briefly, for example for approximately 100 ns, in the aforesaid column lines until the column lines have each reached a level corresponding to the level of the respective signal. Generally, currents of different levels flow at different positions of the read-out circuit 13 at different times on the reading out of an image sensor 10. The two sections of the read-out circuit 13 in particular require fluctuating and/or changing currents and current peaks from the voltage supply.

The read-out circuit 13 of the image sensor 10 usually has a high degree of integration, i.e. a high number of electronic components such as transistors and capacitors. The electronic components are connected via conductor tracks to at least one bond pad 14 provided for the supply of an operating voltage and/or to at least one bond pad 14 provided for the supply of a reference potential.

A small structural size of the electronic components, which also applies to the conductor tracks of the image sensor 10, accompanies the high degree of integration of the electronic components of the image sensor 10. The width and thickness of a conductor track are, for example, in the submicron range. Conductor tracks thereby have a correspondingly high electrical resistance. The high resistivity of the supply network results in voltage dips in the supply with a high current requirement of the aforesaid components and also in fluctuations of the reference potential due to the current backflow.

Mutual interference of the operation of the first section and of the second section of the read-out circuit 13, which can particularly also be caused by the operation at different clock frequencies, can therefore occur due to the aforesaid feedback of a fluctuating current requirement on the operating voltage and/or on the reference potential in combination with the aforesaid realization of the image sensor 10 in a pipeline architecture. In particular fluctuations in the reference potential, which is as a rule provided via the substrate of the semiconductor chip of high ohmage in comparison with the metal conductor tracks, can result in noticeable interference in the respective other section of the read-out circuit. For example, the processing of the signals just located in the second section can suffer interference through high currents in the first section of the read-out circuit.

Figure 2:
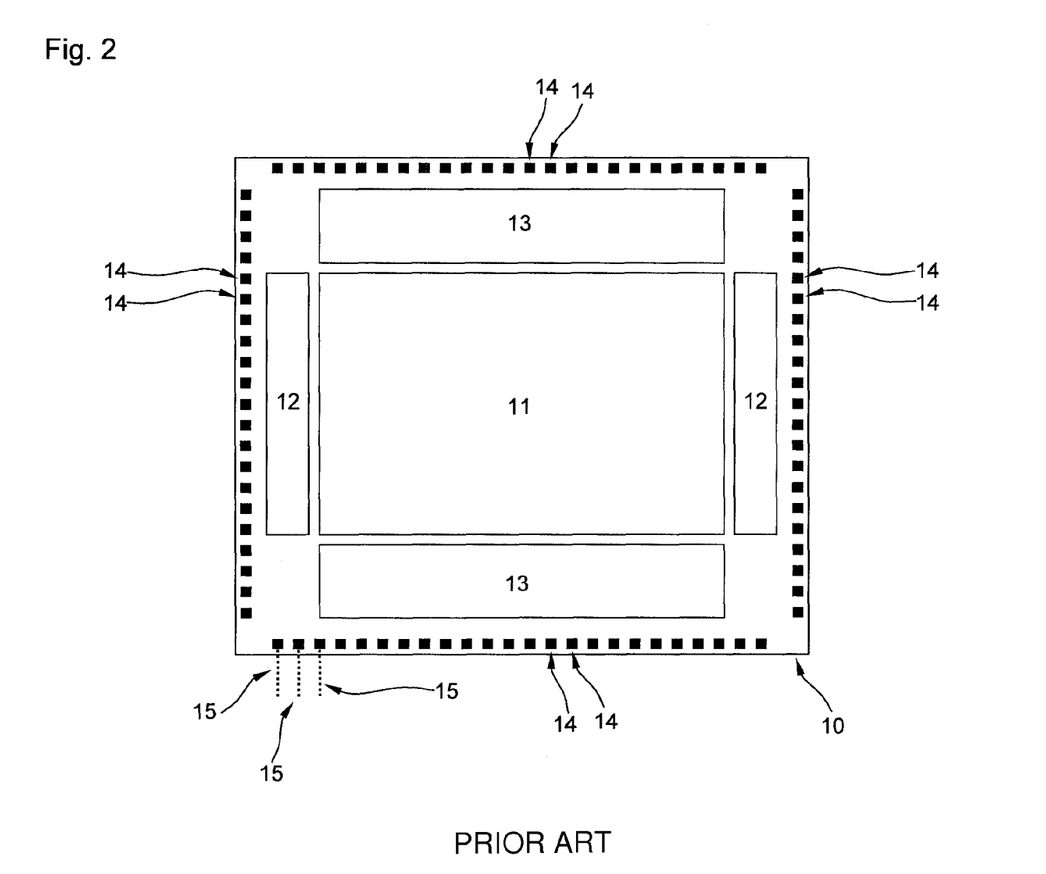
FIG. 2 a further image sensor known from the prior art with a two-part read-out circuit.

A further image sensor 10 known from the prior art is shown in FIG. 2 which only differs from the image sensor shown in FIG. 1 in that the read-out circuit 13 is divided into two, with one part of the read-out circuit 13 being arranged above the image field 11 and one part being arranged beneath the image field 11, and with each of the two parts having an aforesaid first and second section. This is in particular of advantage when the image field 11 is divided into an upper image half and a bottom image half and the upper image half is read out by the upper part of the read-out circuit 13 and the bottom image half is read out by the lower part of the read out circuit 13. The frame rate can hereby be increased even further since in each case two rows, namely one row from the upper image half of the image field 11 and one row from the lower image half, can be read out simultaneously.

It is the underlying object of the invention to provide an image sensor of the initially named kind which avoids interference in the operation of the first section of the read-out circuit by the operation of the second section and vice versa.

The object is satisfied by an image sensor having the features of claim 1 and in particular in that at least some, preferably all, of the bond pads provided for the supply of the operating voltage and/or of the reference potential to the read-out circuit are arranged between the first section and the second section of the read-out circuit.

Pulse currents which arise in one of the two sections of the read-out circuit on a switching can thereby be led off via the bond pads arranged between the two sections and provided for the supply of the operating voltage and/or of the reference potential, whereby an influence on the operation of the other of the two sections of the read-out circuit only takes place to a very much lower degree. The bond wires namely have a substantially larger cross-section than the conductor tracks on the image sensor and thus a much smaller electrical resistance, e.g. by a factor of 10. Bond wires have, for example, a diameter of 32 μm, whereas the thickness of a conductor track on the image sensor is only 0.5 μm.

By the arrangement of bond pads provided for the supply of the operating voltage and/or of the reference potential between the two sections, a largely mutual shielding of the two sections from one another can be achieved. The operation of the two sections of the read-out circuit is thus at least largely uninfluenced by one another.

Furthermore, the lengths of the conductor tracks between the respective bond pads and the first and second sections can be kept particularly short in both cases by the arrangement of bond pads provided for the supply of the operating voltage and/or of the reference potential between the two sections so that feedback on the operating voltage and/or on the reference potential can be kept small from the start.

At least some of the bond pads provided for the supply of the operating voltage and/or of the reference potential to the read-out circuit are in particular not disposed directly at a margin of the image sensor. At least some of the bond pads provided for the supply of the operating voltage and/or of the reference potential to the read-out circuit are spaced apart or separated from a margin of the image sensor by the second section of the read-out circuit, i.e. the second section of the read-out circuit is arranged between the respective bond pads and the respective margin of the image sensor.

The first section and the second section of the read-out circuit are otherwise usually designed as explained above with respect to the prior art. The pixels are preferably arranged in at least one row and in columns, with the first section and the second section of the read-out circuit in each case extending over the total length of a row and/or over all columns. The pixels are further preferably arranged in a one-dimensional or two-dimensional image field, with the first section and the second section of the read-out circuit being arranged adjacent to one another at the same side of the image field.

In accordance with an embodiment of the invention, the first section and/or the second section of the read-out circuit is/are respectively connected to a plurality of bond pads provided for the supply of the operating voltage and/or to a plurality of bond pads provided for the supply of the reference potential. For example, those electronic components which are each provided, for example, for approximately 20 to 50 columns of an image field can be connected to a separate bond pad provided for the supply of an operating voltage and/or to a separate bond pad provided for the supply of a reference potential for each of the two sections of the read-out circuit. This is in particular of advantage when a taken image has strong brightness differences. If, for example, an image of a candle in an otherwise dark room is taken, amplifiers of the first section of the read-out circuit which belong to columns which are disposed in the region of the candle flame, for example, have a high power consumption. The high power consumption can result in a negative influencing of the stability of the operating voltage and of the reference potential in particular with an overmodulation of the amplifiers. This influence would in turn then be carried over to the electronic components of all other columns of the image field which were connected to the same bond pads such that the candle flame would run through the otherwise dark image as a bright horizontal strip, i.e. picture elements would also be influenced which are disposed at a large spacing from the candle flame. Such an influence can be restricted to an only local region by the plurality of bond pads provided for the supply of the operating voltage and/or of bond pads provided for the supply of the reference potential such that no horizontal strip extending through the total image occurs. Furthermore, voltage dips on conductor tracks of the image sensor can be reduced by the plurality of aforesaid bond pads.

At least some, in particular all, of the bond pads provided for the supply of the operating voltage and/or of the reference potential are each connected to only one of the two sections of the read-out circuit. Separate bond pads are therefore provided for the two sections of the read-out circuit. The operating voltage and/or the reference potential is/are therefore provided to the two sections separately. Feedback on the operation of the one section on the operation of the other section can hereby be avoided even better.

The bond pads provided for the supply of the operating voltage and/or of the reference potential can be arranged along an in particular inner bond pad row, with the individual bond pads preferably being arranged at least substantially equidistant. In this respect, all the bond pads of the bond pad row can be provided for the supply of the operating voltage and/or of the reference potential.

In accordance with another embodiment of the invention, a further, in particular outer, bond pad row with at least substantially equidistant bond pads can be provided. The further bond pad row can in particular be arranged on the side of the second section of the read-out circuit remote from the pixels. The two bond pad rows are preferably then offset from one another so that the bond wires for the two bond pad rows can be arranged next to one another and do not have to extend over one another.

The two bond pad rows can have the same bond pad density. It is, however, also possible that the bond pads are only arranged half as densely in the inner bond pad row. The bond pad wires of the inner row can then also be guided between the bond pads of the outer row. It is more easily possible to lay the lines which connect the two sections of the evaluation circuit to one another by the larger spacing of the bond pads of the inner bond pad row. In addition, a completely arbitrary arrangement of the bond pads of the inner row is also possible. The bond wires which contact the inner row must then possibly be guided in a different plane, i.e. they are then disposed above the bond wires of the outer row, for example.

In accordance with a further embodiment of the invention, two read-out circuits are provided which are arranged at mutually oppositely disposed sides with respect to the pixels, which are each designed as explained above and which are each connected to bond pads as explained above, with separate bond pads being provided for each read-out circuit as explained above.

Advantageous embodiments of the invention are also set forth in the dependent claims, in the description and in the drawing.

The invention will be described in the following by way of example with reference to the drawing. There are shown, schematically in each case.

Figure 3:
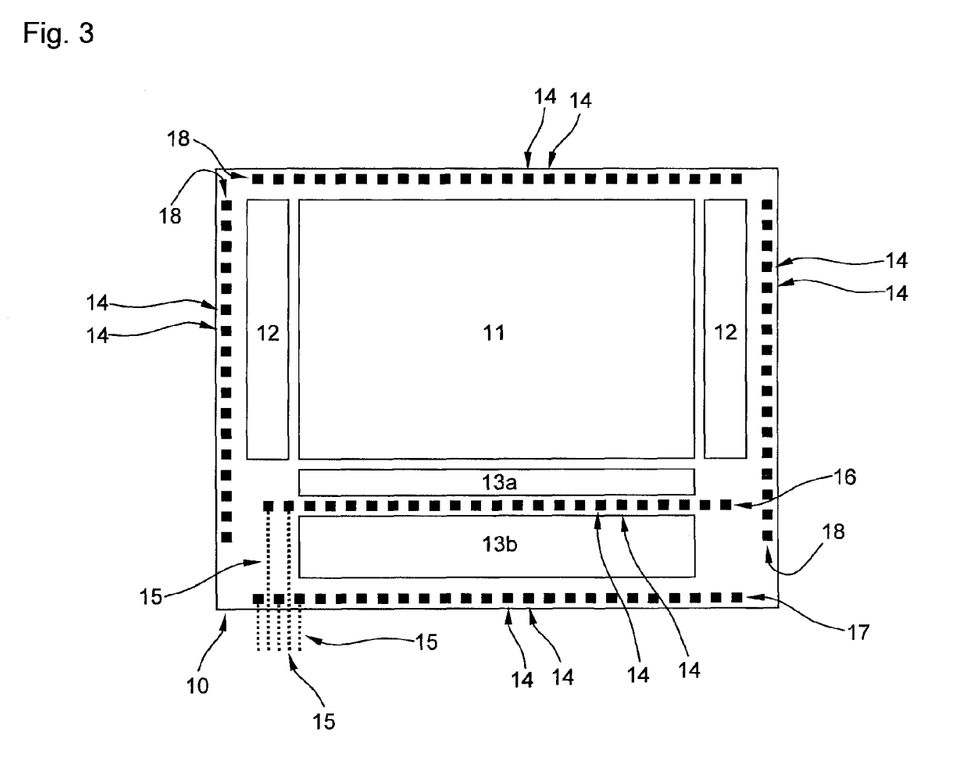
FIG. 3 an image sensor in accordance with the invention with a one-part read-out circuit.

The image sensor 10 shown in FIG. 3 in accordance with a first embodiment includes—analogously to the image sensor known from the prior art in accordance with FIG. 1—a plurality of pixels which are arranged in rows and columns, which each generate a signal proportional to an exposure and which together form a two-dimensional image field or pixel field 11. The image sensor 10 furthermore includes a row selection circuit or control circuit 12 divided into two, a read-out circuit 13 and, optionally, also a flow control, not shown. Furthermore, a plurality of bond pads 14 are provided which are connected to inputs and outputs of the aforesaid circuit parts to return external control signals to the image sensor 10 via the bond pads 14 to output pixel signals externally and to supply an operating voltage and a reference potential, namely ground, to the image sensor 10.

The row selection circuit 12 and the read-out circuit 13 are each coupled with the pixel field 11, with the two parts of the row section circuit 12 each being arranged in the longitudinal direction of the rows or of row lines of the pixel field 11 and the read-out circuit 13 being arranged in the longitudinal direction of the columns or of column lines of the pixel field 11. The read-out circuit 13 preferably extends over the total width of the image field 11, i.e. over all the columns or column lines.

The read-out circuit 13 of the image sensor 10 in accordance with FIG. 3 includes a first section 13a and a second section 13b, with the second section 13b being disposed downstream of the first section 13a in the signal read-out direction, as was already explained above with respect to the prior art. The first section 13a of the read-out circuit 13 is configured for the row-wise reading out of the signals of the pixels of the image field 11 and includes a sample-and-hold circuit for each of the columns of the image field 11 for the storing of the signal of the pixel of the respective read out row and a column amplifier device for the amplification of the respective signal.

The second section 13b of the read-out circuit 13 includes a multiplexer device to output the read out signals of a respective row, which are applied in the first section 13a of the read-out circuit 13, after one another or sequentially at at least one output of the read-out circuit 13. The read-out circuit 13 in particular includes a plurality of such outputs so that a plurality of read out signals of a respective row, i.e. groups of read out signals, are output simultaneously or parallel. Furthermore, the second section 13b of the read-out circuit 13 can have one or more analog-to-digital converters to digitize the read out signals before they are output to an external device. In addition, the second section 13b can include one or more output amplifiers to amplify the read out signals before they are output to an external device.

The first section 13 of the read-out circuit 13 works at a first clock frequency, namely the row rate, and the second section 13b of the read-out circuit 13 works with a second clock frequency, namely the pixel rate. Since the signals of the pixels of a total row are processed simultaneously in the first section 13a of the read-out circuit 13 and since, in contrast, in each case only one single such signal or an in particular small group of signals is processed in the second section 13b of the read-out circuit 13, the second section 13b of the read-out circuit 13 works at a higher clock frequency than the first section 13a of the read-out circuit 13.

In contrast to the image sensor 10 in accordance with FIG. 1 in which the first and second sections of the read-out circuit 13 are directly adjacent to one another so that the two sections of the read-out circuit 13 in FIG. 1 are consequently also shown as a uniform block 13, in the image sensor in accordance with FIG. 3 present in the form of a semiconductor chip, an inner bond pad row 16 of a plurality of individual equidistant bond pads 14 are arranged between the two sections 13a, 13b of the read-out circuit 13, with the two sections 13a, 13b of the read-out circuit 13 being arranged on the same side of the image field 11.

The bond pads 14 of the inner bond pad row 16 are exclusively bond pads 14 which are provided for the supply of the operating voltage and the ground to the two sections 13a, 13b of the read-out circuit 13 of the image sensor 10 or of image sensor chips or of semiconductor chips. The inner bond pad row 16 can, however, naturally also include bond pads 14 which satisfy a different function.

Interference in the operation of the first section 13a of the read-out circuit 13 by the simultaneous operation of the second section 13b, and vice versa, can largely be avoided by this measure and the at least largely mutual shielding and decoupling of the two sections 13a, 13b of the read-out circuit 13 from one another associated therewith. The aforesaid mutual shielding, in particular electromagnetic shielding, can in particular be achieved in that the respective bond pads 14 and the bond wires connected thereto lie on a constant electrical potential.

Such interference could otherwise arise in that fluctuations of the operating voltage and of the reference potential which influence the respective other section 13b, 13a can occur due to a power requirement of one of the two sections 13a, 13b of the read-out circuit 13 which fluctuates in operation in combination with high electrical resistances of the conductor tracks ensuring the respective supply. Such interference would in particular be probable since the two sections 13a, 13b of the read-out circuit 13 are operated at very different clock frequencies.

The supply lines to both sections 13a, 13b can additionally be kept relatively short in each case by the arrangement of the inner bond path row 16 in direct proximity to both sections 13a, 13b of the read-out circuit 13 so that the aforesaid fluctuations already occur only to a reduced degree. The sections 13a, 13b of the read-out circuit 13 are in this respect each connected to the bond pads 14 of the bond pad row 16 via their own conductor tracks.

The electrical connection of these bond pads 14 via conductor tracks to the inputs and outputs of the two sections 13a, 13b of the read-out circuit 13 is in this connection preferably selected such that separate bond pads 14 are provided for the two sections 13a, 13b, i.e. at least some, and preferably all, of the aforesaid bond pads 14 for the supply of the operating voltage and ground to the read-out circuit 13 are in each case connected either only to the first section 13a of the read-out circuit 13 or only to the second section 13b.

Not only a bond pad 14 providing the operating voltage and not only a bond pad 14 providing the reference potential are provided for the total first section 13a of the read-out circuit 13, but rather in each case a plurality of bond pads 14 are provided, with a separate bond pad 14 being provided for the operating voltage and a separate bond pad 14 being provided for ground, for example for 20-50 columns each. Bright strips running transversely through the total image can hereby be avoided, as has already been explained above.

In addition to the inner bond pad row 16, an outer bond pad row 17 with equidistant bond pads 14 is provided which is arranged on the side of the second section 13b of the read-out circuit 13 disposed opposite the bond pad row 16 and thus at the lower image sensor margin. The bond pads 14 of the outer band pad row 17 can, for example, be bond pads 14 which are provided for the reception of control signals for the different circuit parts of the image sensor 10 and/or for the output of the optionally amplified pixel signals of the read-out circuit 13. Generally, however, one or more bond pads 14 can also be found beneath the bond pads 14 of the outer bond pad row 17 which provide the operating voltage and/or ground and/or are in each case connected to only one of the two sections 13a, 13b of the read-out circuit 13. Further outer bond pad rows 18 are provided beside the aforesaid outer bond pad row 17 so that the image sensor 10 is provided with bond pad rows peripherally at the outer margin.

Figure 5:
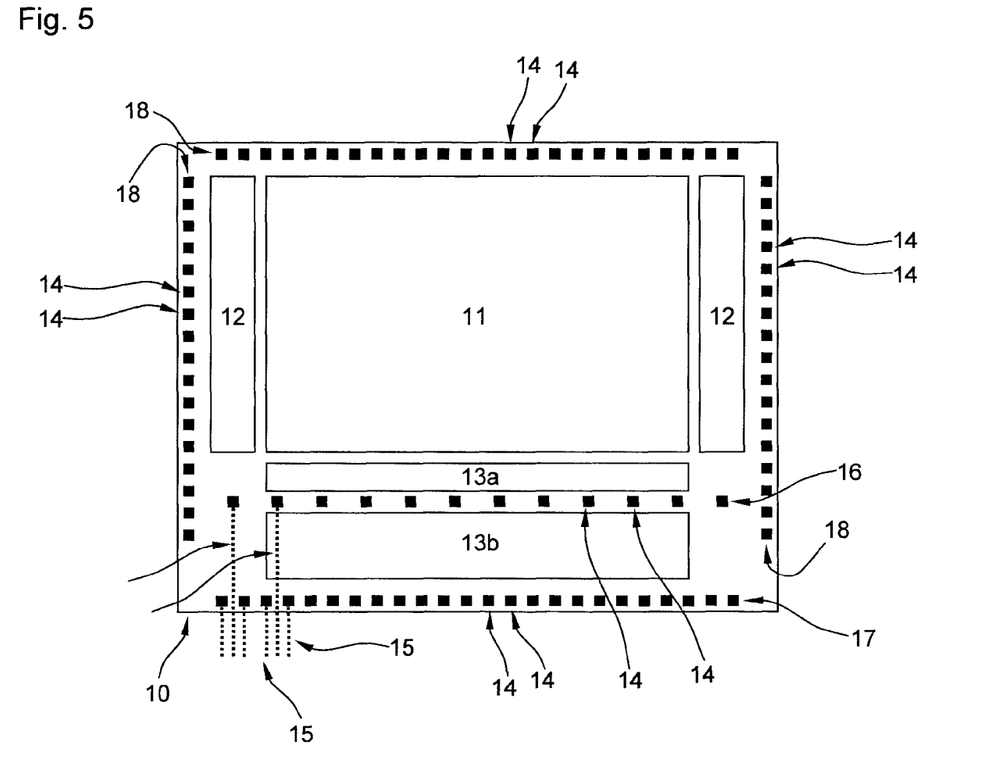
FIG. 5 an image sensor in accordance with the invention in accordance with a variant of the first embodiment of FIG. 3.

The bond pads 14 of the outer bond pad row 17 and the bond pads 14 of the inner bond pad row 16 usually have the same spacings from one another. The outer bond pad row 17 is offset with respect to the inner bond pad row 16 by half such a spacing. This makes it possible that bond wires 15, which are bonded onto the bond pads 14 of the inner bond pad row 16, can extend between the bond wires 15, which are bonded to the bond pads 14 of the outer bond pad row 17. In FIG. 5, an alternative to the first embodiment shown in FIG. 3 is shown, in which alternative, in contrast to FIG. 3, only every second bond pad 14 of the inner bond pad row 16 is provided, i.e. the inner bond pad row 16 of the alternative has only half the pattern with respect to FIG. 3, with the bond wires 15 of the inner bond pad row 16 also being able to be guided between the bond wires 15 of the outer bond pad row 17 in this case.

Figure 4:
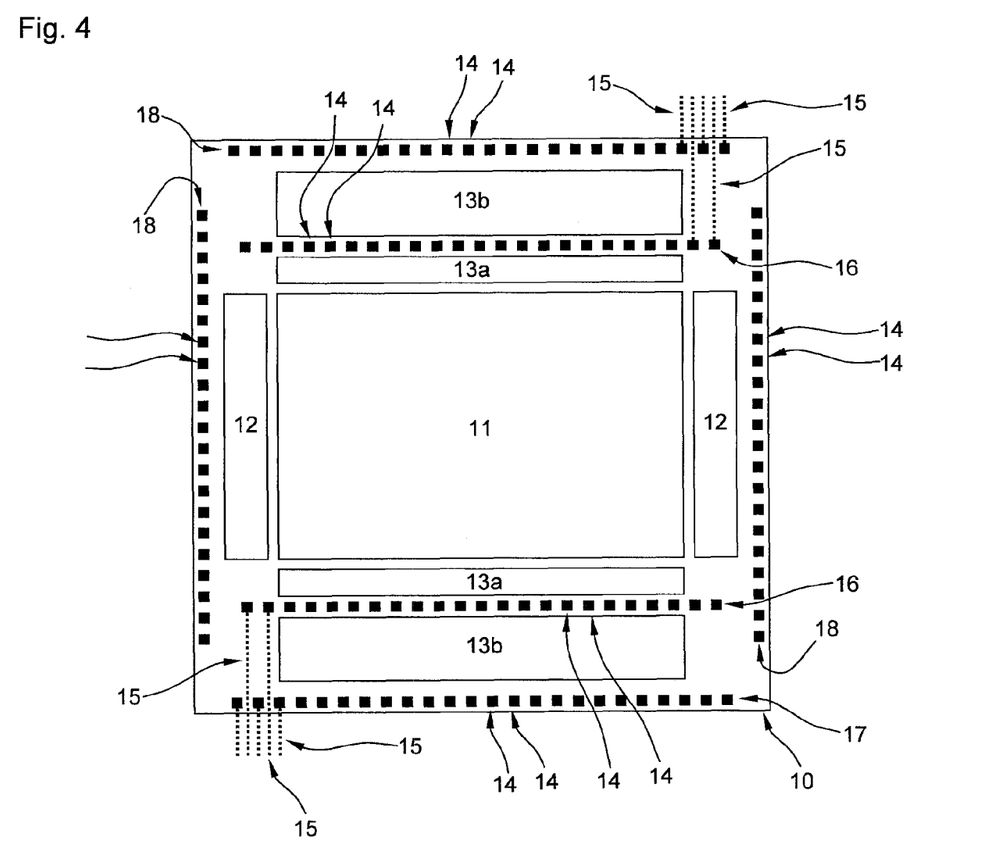
FIG. 4 an image sensor in accordance with the invention in accordance with a second embodiment, with a two-part read-out circuit.

An image sensor 10 in accordance with a second embodiment is shown in FIG. 4. The image sensor 10 in accordance with FIG. 4 differs from the image sensor 10 in accordance with FIG. 3 in that the read-out circuit 13 has two parts, of which the one part is arranged above the image field 11 and the other part is arranged beneath the image field 11. Such a division is used when the image field 11 is divided into two and an upper half of the image field 11 is read-out by the upper part of the read-out circuit 13 and the lower half of the image field 11 is read out by the lower part of the read-out circuit 13. Each of the two parts of the read-out circuit 13 then has an aforesaid first section 13a and an aforesaid second section 13b and a separate inner bond pad row 16 is provided for each of the two parts of the read-out circuit 13.

A mutual negative influencing of the two sections, in particular working at different speeds, of a read-out circuit of an image sensor can thus at least largely be avoided by the present invention.

REFERENCE NUMERAL LIST 10 image sensor
11 image field
12 row selection circuit
13 read-out circuit
13a first section of the read-out circuit
13b second section of the read-out circuit
14 bond pad
15 bond wire
16 inner bond pad row
17 outer bond pad row
18 further outer bond pad row

The invention claimed is:

1. An image sensor for electronic cameras, comprising a plurality of light-sensitive pixels for the generation of signals proportional to exposure and at least one read-out circuit (13a, 13b) coupled to the pixels and having a first section (13a) and having a second section (13b) disposed downstream of the first section (13a) in a signal read-out direction, wherein the first section (13a) and the second section (13b) of the read-out circuit (13a, 13b) are each connected to one or more supply bond pads, each of the one or more supply bond pads provided for the supply of an operating voltage for the supply of a reference potential, wherein at least some of the supply bond pads (14) are arranged between the first section (13*a*) and the second section (13*b*) of the read-out circuit (13*a*, 13*b*), and wherein the pixels the read-out circuit (13*a*, 13*b*) and the supply bond pads (14) are arranged on the same semiconductor chip.

2. An image sensor in accordance with claim 1, wherein the image sensor (10) is configured to operate the first section (13*a*) of the read-out circuit (13*a*, 13*b*) at a first clock frequency and the second section (13*b*) at a second clock frequency, with the second clock frequency being higher than the first clock frequency.

3. An image sensor in accordance with claim 1, wherein the pixels are arranged in at least one row and in columns; and wherein the first section (13*a*) of the read-out circuit (13*a*, 13*b*) is configured to read-out the signals of the pixels row-wise and the second section (13*b*) is configured to output the read out signals of a respective row or groups of read out signals of a respective row sequentially.

4. An image sensor in accordance with claim 1, wherein the first section (13*a*) of the read-out circuit (13*a*, 13*b*) comprises at least one of sample-and-hold circuits or column amplifiers.

5. An image sensor in accordance with claim 1, wherein the second section (13*b*) of the read-out circuit (13*a*, 13*b*) comprises at least one of a multiplexer circuit, an analog-to-digital converter or an output amplifier.

6. An image sensor in accordance with claim 1, wherein the pixels are arranged in at least one row and in columns; and wherein the first section (13*a*) and the second section (13*b*) of the read-out circuit (13*a*, 13*b*) each extend over at least one of the total length of a row or over all columns.

7. An image sensor in accordance with claim 1, wherein at least one of the first section (13*a*) or the second section (13*b*) of the read-out circuit (13*a*, 13*b*) are each connected to a plurality of the supply bond pads (14).

8. An image sensor in accordance with claim 1, wherein all of the supply bond pads (14) are arranged between the first section (13*a*) and the second section (13*b*) of the read-out circuit (13*a*, 13*b*).

9. An image sensor in accordance with claim 1, wherein the pixels are arranged in a one-dimensional or two-dimensional image field (11), with the first section (13*a*) and the second section (13*b*) of the read-out circuit (13*a*, 13*b*) being arranged adjacent to one another at the same side of the image field (11).

10. An image sensor in accordance with claim 1, wherein the at least some of the supply bond pads (14) are each connected to only one of the two sections of the read-out circuit (13*a*, 13*b*).

11. An image sensor in accordance with claim 1, wherein the at least some of the supply bond pads (14) are arranged along a bond pad row (16).

12. An image sensor in accordance with claim 11, wherein all bond pads (14) of the bond pad row (16) are supply bond pads (14).

13. An image sensor in accordance with claim 11, wherein a further bond pad row (17) with at least substantially equidistant bond pads (14) is provided.

14. An image sensor in accordance with claim 13, wherein the further bond pad row (17) is arranged on the side of the second section (13*b*) of the read-out circuit (13*a*, 13*b*) remote from the pixels.

15. An image sensor in accordance with claim 13, wherein the bond pad rows (16) and the further bond pad row (17) are arranged parallel to one another along a row direction, wherein the individual bond pads (14) of the bond pad row (16) are offset along the row direction with respect to the individual bond pads (14) of the further bond pad row (17).

16. An image sensor in accordance with claim 1, wherein the at least some of the supply bond pads (14) are spaced apart from a margin of the image sensor by the second section of the read-out circuit.

17. An image sensor in accordance with claim 1, wherein two read-out circuits (13*a*, 13*b*) are provided which are arranged on mutually oppositely disposed sides with respect to each of the said plurality of light-sensitive pixels and which are each connected to one or more of the supply bond pads (14).

18. An image sensor for electronic cameras, comprising a plurality of light-sensitive pixels for the generation of signals proportional to exposure and at least one read-out circuit (13*a*, 13*b*) coupled to the pixels and having a first section (13*a*) and having a second section (13*b*) disposed downstream of the first section (13*a*) in a signal read-out direction, wherein
the first section (13*a*) and the second section (13*b*) of the read-out circuit (13*a*, 13*b*) are each connected to one or more supply bond pads, each of the one or more supply bond pads provided for the supply of an operating voltage or for the supply of a reference potential, and
all of the supply bond pads (14) are arranged between the first section (13*a*) and the second section (13*b*) of the read-out circuit (13*a*, 13*b*).

19. An image sensor for electronic cameras, comprising a plurality of light-sensitive pixels for the generation of signals proportional to exposure and at least one read-out circuit (13*a*, 13*b*) coupled to the pixels and having a first section (13*a*) and having a second section (13*b*) disposed downstream of the first section (13*a*) in a signal read-out direction, wherein
the first section (13*a*) and the second section (13*b*) of the read-out circuit (13*a*, 13*b*) are each connected to one or more supply bond pads, each of the one or more supply bond pads provided for the supply of an operating voltage or for the supply of a reference potential,
at least some of the supply bond pads (14) are arranged between the first section (13*a*) and the second section (13*b*) of the read-out circuit (13*a*, 13*b*), and
the at least some of the supply bond pads (14) are each connected to only one of the two sections of the read-out circuit (13*a*, 13*b*).

20. An image sensor for electronic cameras, comprising a plurality of light-sensitive pixels for the generation of signals proportional to exposure and at least one read-out circuit (13*a*, 13*b*) coupled to the pixels and having a first section (13*a*) and having a second section (13*b*) disposed downstream of the first section (13*a*) in a signal read-out direction, wherein
the first section (13*a*) and the second section (13*b*) of the read-out circuit (13*a*, 13*b*) are each connected to one or more supply bond pads, each of the one or more supply bond pads provided for the supply of an operating voltage or for the supply of a reference potential,
at least some of the supply bond pads (14) are arranged between the first section (13*a*) and the second section (13*b*) of the read-out circuit (13*a*, 13*b*),
the at least some of the supply bond pads (14) are arranged along a bond pad row (16), and
all bond pads (14) of the bond pad row (16) are supply bond pads (14).

21. An image sensor for electronic cameras, comprising:
a plurality of light-sensitive pixels;

at least one read-out circuit coupled to the pixels and having a first section and a second section, said second section being disposed downstream of the first section in a signal read-out direction; and a plurality of bond pads some of which are supply bond pads provided for the supply of one of an operating voltage and a reference potential to the at least one read-out circuit;

wherein each of said supply bond pads is connected to one of the first section and the second section of the at least one read-out circuit;

wherein at least some of the supply bond pads are arranged between the first section and the second section of the at least one read-out circuit; and wherein the plurality of light-sensitive pixels, the at least one read-out circuit and the plurality of bond pads are arranged on a single semiconductor chip.

22. An image sensor in accordance with claim 21, wherein the plurality of bond pads further comprises input bond pads provided for the reception of control signals and output bond pads provided for the output of pixel signals.

\* \* \* \* \*